United States Patent [19]
Shimizu

[11] Patent Number: 5,337,749
[45] Date of Patent: Aug. 16, 1994

[54] MAGNETIC RESONANCE VASCULAR IMAGING

[75] Inventor: Koji Shimizu, Kyoto, Japan

[73] Assignee: Shimadzu Corporation, Kyoto, Japan

[21] Appl. No.: 983,325

[22] Filed: Nov. 30, 1992

[30] Foreign Application Priority Data

Nov. 30, 1991 [JP] Japan .................................. 3-342004

[51] Int. Cl.⁵ ............................................ A61B 5/055
[52] U.S. Cl. ............................. 128/653.3; 128/653.5;
324/306; 324/318
[58] Field of Search ............... 128/653.2, 653.3, 653.5;
324/306, 309, 318, 322

[56] References Cited

U.S. PATENT DOCUMENTS 4,983,921  1/1991  Kramer et al. ...................... 324/309
5,031,624  7/1991  Mistretta et al. .................. 128/653.3

Primary Examiner—Ruth S. Smith
Attorney, Agent, or Firm—Heller, Ehrman, White & McAuliffe

[57] ABSTRACT

An improved magnetic resonance vascular imaging technique produces an image of a flowing liquid such as blood inside a vessel with high contrast both towards the upstream and downstream sides of an excitation region by effecting RF excitation such that the flip angle changes along the direction of the flow within the region.

6 Claims, 3 Drawing Sheets

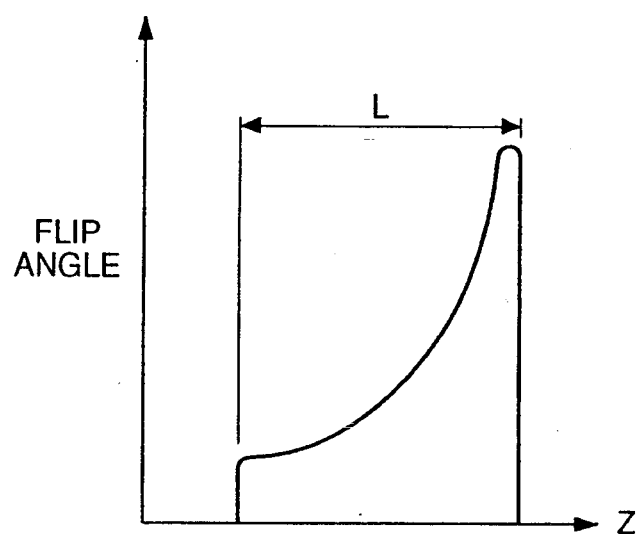
FIG._1
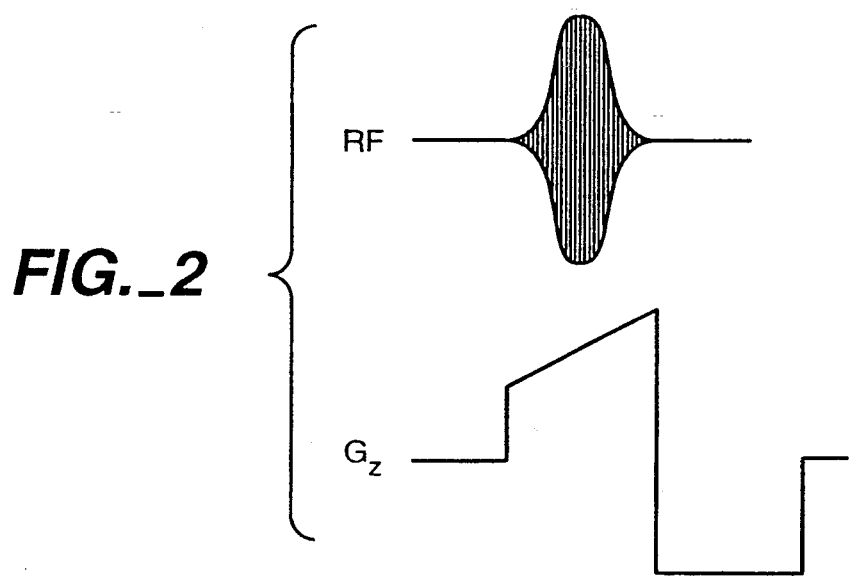
FIG._2
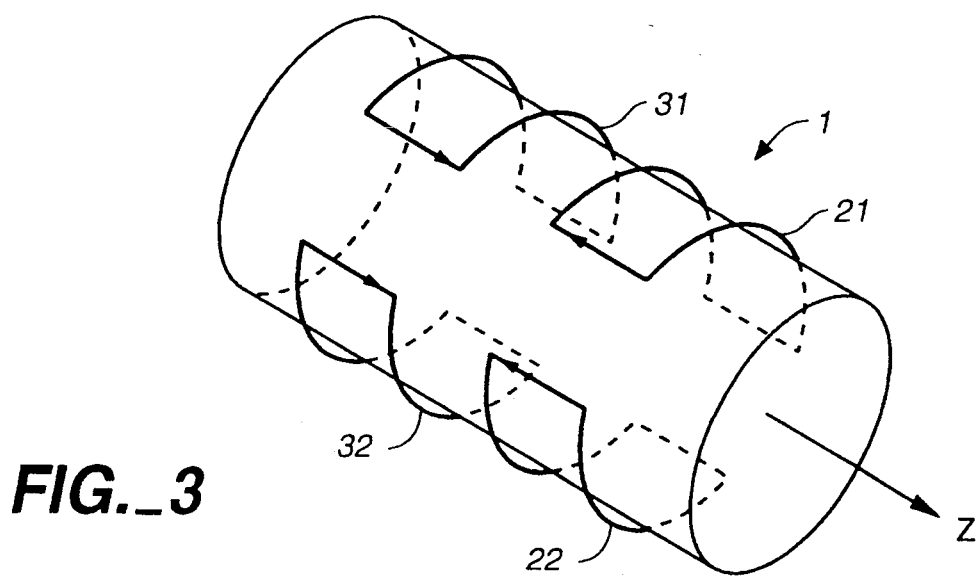
FIG._3

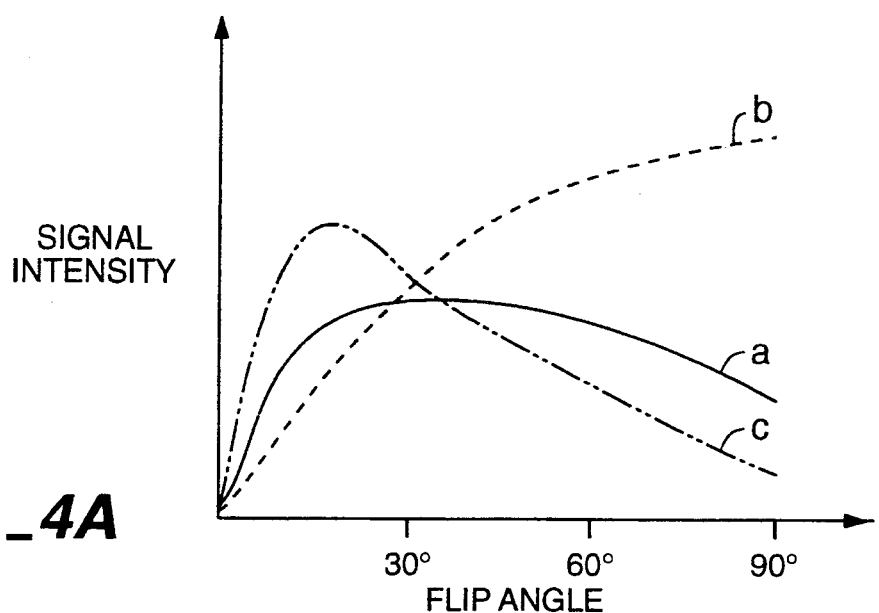
FIG._4A
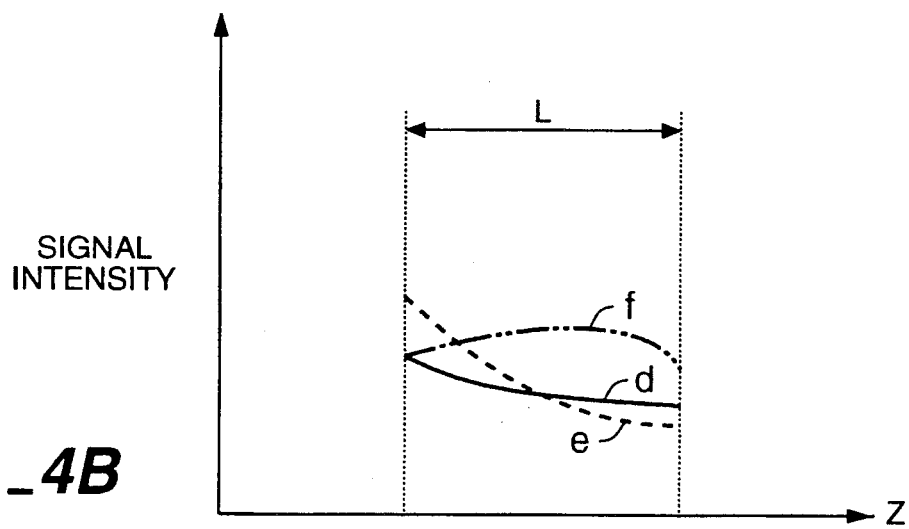
FIG._4B
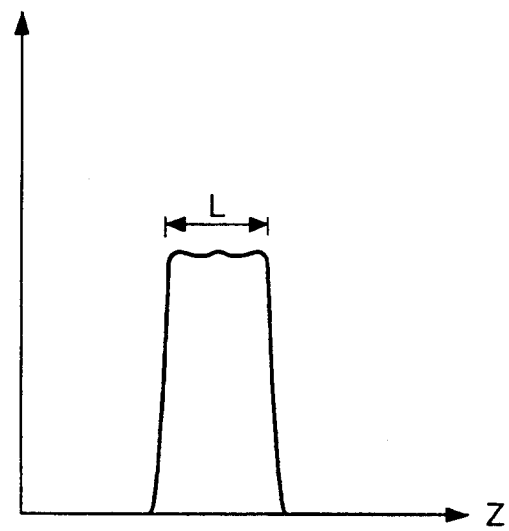
FIG._8
*(PRIOR ART)*

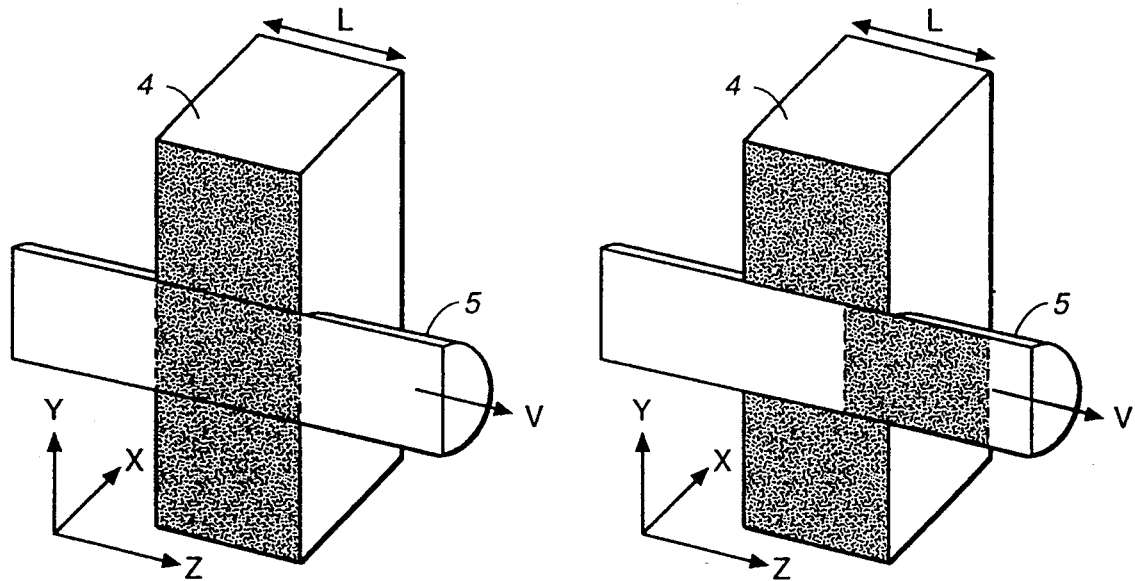
FIG._5     FIG._6
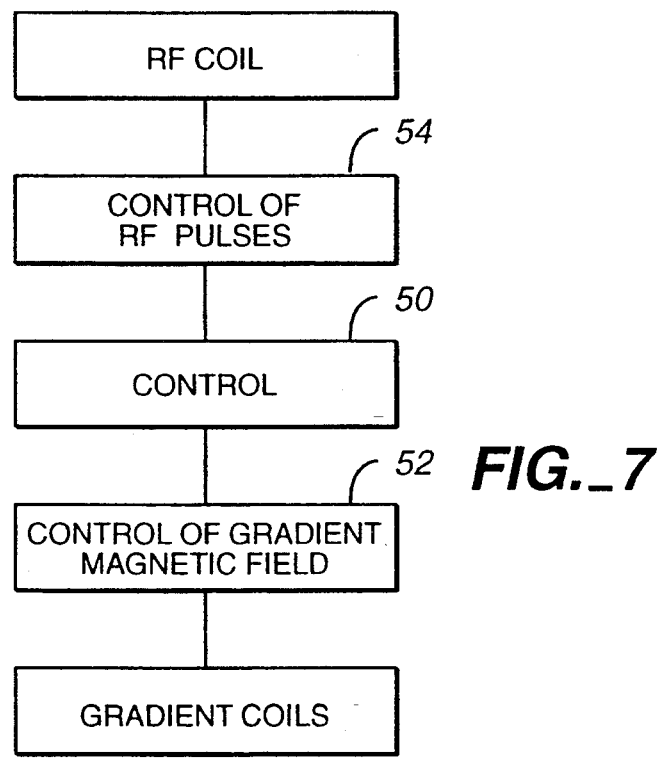
FIG._7

MAGNETIC RESONANCE VASCULAR IMAGING

BACKGROUND OF THE INVENTION

This invention relates to magnetic resonance imaging which makes use of nuclear magnetic resonance (NMR). More particularly, the invention relates to methods and apparatus for magnetic resonance vascular imaging adapted for obtaining a high-contrast image of a part including a flow such as the cardiovascular system.

Stated briefly, magnetic resonance imaging methods comprise the steps of positioning an object to be investigated in a magnetic field in order to align unpaired nuclear spins parallel to the field and irradiating the object with radio frequency (RF) excitation pulses in order to thereby tip the spins by an angle (or the flip angle).

Magnetic resonance angiography techniques such as the time-of-flight (TOF) methods and the phase-sensitive methods have been known for producing images with vascular contrast by making use of the flow of blood in vessels. The time-of-flight methods are so called because they make use of the time-of-flight effects of the motion of blood flow, as will be explained below. The phase-sensitive methods make use of motion-induced phase shift effects.

According to a time-of-flight method, a slab-like region (hereinafter referred to as an excitation slab) 4 of thickness L perpendicular to a vessel 5 is selectively excited first as shown in FIG. 5. After time TR, the same slab-like region is again selectively excited by a pulse. Since blood is flowing inside the vessel 5 at a speed of V, a part of the blood which was earlier excited has flowed out of the excitation slab 4 as shown in FIG. 6 by the time the next excitation pulse is applied. Since a new supply of fully relaxed blood (not yet excited) enters this excitation slab 4 in the meantime, a maximum signal can be obtained from such a not-yet-excited blood portion if the flip angle of the excitation pulse is 90°. In a situation, as shown in FIG. 6, where a portion of the earlier excited part of the blood is still remaining on the downstream side inside the excitation slab 4, however, it is an excitation pulse of a small flip angle that generates a maximum signal from this portion. This situation of having earlier excited blood remaining occurs most prominently where the downstream side connects to a peripheral vessel. In such a situation, the time-of-flight effect will be different between the upstream and downstream sides within the same excitation slab 4. FIG. 8 shows the prior art profile of flip angle, that is, the prior art distribution of the flip angle in the direction of the thickness of the excitation slab 4 indicated as the Z-direction in FIGS. 5 and 6. A high-contrast image of the entire vessel 5 cannot be obtained if the flip angle is uniform along the direction of the flow of blood as shown in FIG. 8.

By the phase-sensitive methods, too, excitation must be repeated many times for imaging. If an excitation pulse of same flip angle is applied to both the freshly introduced portion of the blood which has not been excited yet and the remaining portion of the blood which has been excited many times already, there arises the problem of not being able to optimize the signal intensity from the blood from all parts if the slab.

SUMMARY OF THE INVENTION

It is therefore an object of this invention to provide improved magnetic resonance vascular imaging methods and apparatus whereby an image of a liquid in an excitation slab can be obtained optimally both on its downstream and upstream sides.

According to a magnetic resonance vascular imaging method embodying the present invention, with which the above and other objects can be accomplished, a sequencing means or an excitation RF coil is provided such that the flip angle inside a desired excitation slab, into which a liquid flows, will change according to the position of the liquid along its direction of flow. In this manner, excitation can be effected with different flip angles between the upstream and downstream sides such that the liquid can be imaged optimally throughout from the upstream side to the downstream side.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a graph of the flip angle profile of an excitation pulse applied according to the present invention;

FIG. 2 is a time chart showing an example of pulse sequence for obtaining the excitation characteristics shown in FIG. 1;

FIG. 3 is a schematic diagonal view of an example of RF excitation coil for obtaining the excitation characteristics shown in FIG. 1;

FIGS. 4-A and 4-B are graphs showing the relationship between the flip angle and signal intensity at different positions;

FIG. 5 is a schematic diagonal view of a TOF process immediately after excitation;

FIG. 6 is a schematic diagonal view of a TOF process immediately before the next excitation;

FIG. 7 is a schematic block diagram of the control system of a magnetic resonance imaging apparatus; and FIG. 8 is a graph of the flip angle profile of an excitation pulse applied according to the prior art technology.

DETAILED DESCRIPTION OF THE INVENTION

An embodiment of the present invention is explained next with reference to FIG. 1, which shows the flip angle profile of excitation pulse according to the present invention. When an excitation slab as shown in FIGS. 5 and 6 is selectively excited by such a pulse, the flip angle varies along the direction of its thickness (that is, the Z-direction which represents the direction of blood flow). As shown in FIG. 1, the flip angle is very small and nearly 0° on the upstream side (on the left-hand side) of the excitation slab 4, increasing gradually as one moves to the downstream side (to the right-hand side).

Such a flip angle profile can be obtained by means of a pulse sequence shown in FIG. 2. In other words, the magnitude of the slice selective gradient magnetic field (expressed as $G_z$, the slice selection being in the Z-direction) is gradually changed, and the carrier frequency of the excitation RF pulse is changed at the same time as shown in FIG. 2.

Alternatively, use may be made of a differential RF coil 1 as shown in FIG. 3. Such a differential RF coil I may comprise four coil segments 21, 22, 31 and 32 arranged on a cylinder such that segments 21 and 22 and segments 31 and 32 and opposite to each other with respect to the cylinder and that segments 21 and 31 and segments 22 and 32 are disposed next to each other along the longitudinal direction. If currents are caused to flow in these segments 21, 22, 31 and 32 such that currents in segments 21 and 22 are in opposite direction to those in segments 31 and 32, a RF sensitivity gradient can be generated in the Z-direction (the axial direction of the cylinder) in which blood flows. If such a differential RF coil 1 is used, an excitation profile in the Z-direction as shown in FIG. 1 can be realized even with an excitation pulse (waveform) of a prior art excitation characteristic as shown in FIG. 8. In such a situation, use may be made of RF pulse and slice selective gradient magnetic field pulse according to a prior art method.

FIG. 4-A is presented for explaining general effect of flip angle in different parts and in particular the effects of so-called T1 saturation (or longitudinal saturation), relating to a situation where repeated excitations take place twice in a TOF method, showing the relationship between the signal intensity and flip angle of the second excitation pulse when the time interval TR between the pulses is 50 ms (which is much shorter than the T1 relaxation times for human tissues). In a stationary tissue part, since the second pulse will be causing re-excitation, stronger signals can be obtained at a lower flip angle, as shown by Curve "a". As for the portion of blood which has just entered the excitation slab 4, since there is no effect of T1 saturation to be considered and since it is excited for the first time by every RF pulse, a larger signal is produced by a pulse with flip angle of 90° as shown by Curve "b". The portion of the blood, which was excited by the previous RF pulse but is still remaining inside the excitation slab 4 (in particular in the downstream part thereof), has characteristics similar to the static tissue part, producing larger signals for lower flip angles. Since the use of a large flip angle intensifies the T1 saturation in the downstream part of the slab 4, the signal intensity therefrom becomes accordingly weaker as shown by Curve "c". In other words, the flip angle is made large, large signals can be obtained from the blood on the upstream side but the signal intensity from the blood in the downstream part becomes weak, as shown by Curve "e" of FIG. 4-B. In order to increase the signal intensity from the downstream part, therefore, it must be a pulse with a small flip angle (instead of a large flip angle) that must be applied in the upstream part of the slab 4. As shown by Curve "d" of FIG. 4-B, if a small flip angle is used throughout the slab 4, the signal intensity from the upstream part of the slab 4 drops somewhat but its sharp drop in the downstream part can be prevented. According to the technique shown in FIG. 2 or 3, the flip angle increases along the Z-axis, being small on the upstream end and large on the downstream end. The signal intensity from the upstream part will not be as strong as if a larger flip angle is used but is still sufficiently large, as explained above. In the downstream part, the flip angle is made larger to increase the signal intensity. This can be done without incurring any disadvantage because the resultant blood with high T1 saturation flows out of the slab 4 and its low signal intensity is not a detriment. In summary, it is possible to obtain reasonably large signals from all parts of the blood flow, the variation in the signal intensity along the Z-direction becoming small as shown by Curve "f" of FIG. 4-B. In other words, the imaging of the blood vessel 5 can be accomplished optimally in all parts. Even if the downstream side connects to peripheral vessels, for example, both the larger vessels on the upstream side and the peripheral vessels on the downstream side can be imaged with improved contrast. Since peripheral vessels are excited at high flip angles, furthermore, signals from stationary tissue regions are stopped such that the contrast from vessel parts can be improved.

A two-dimensional image of the excitation slab 4 can be obtained by effecting frequency encoding in the X-direction and phase encoding in the Y-direction after a selective excitation of the excitation slab 4 by a RF pulse. A three-dimensional image can also be obtained if phase encoding is effected additionally in the Z-direction. In so obtaining a three-dimensional image by dividing the excitation slab 4 into many parts in the direction of its thickness (Z-direction), it is effective to carry out the kind of excitation sequencing to thereby make use of a distribution of flip angles as described above.

The present invention can be applied also to the phase-sensitive method of magnetic resonance angiography. Since the flip angle can be made small on the upstream side and large on the downstream side, the signal intensity from every part of a slab can be made large and hence the signal-to-noise ratio can be improved. Either by the TOF or phase-sensitive method, since the distribution of the flip angle is so as to weaken the signal intensity for a blood flow in the opposite direction, the imaging of such a vessel is inhibited. In other words, it is possible to image selectively only the arterial or venous flows.

The present invention has been described above in terms of only a few embodiments, but these embodiments are intended to merely illustrate the principles of the invention. Many modifications and variations may be possible within the spirit of the invention. Regardless of the manner in which the present invention is implemented, the apparatus for using the method of the invention may be structured generally as shown in FIG. 7 wherein numeral 50 indicates a control device for controlling the overall operation of the apparatus, numeral 52 indicates a control device for controlling the application of the gradient magnetic field to a target object such as a selected part of a blood vessel, and numeral 54 indicates a control device for controlling the application of RF excitation pulses. Magnetic resonance imaging apparatus thus controlled have generally been known and extensively described, and hence will not be described here in any detail. In summary, the present invention provides an improved magnetic resonance imaging technique whereby the flip angle can be optimized at every position within an excitation slab such that the quality of image of a flow can be improved. It is particularly effective for the imaging of a flowing system with a thick excitation slab.

What is claimed is:

1. In a magnetic resonance imaging method including the steps of defining a slab-like region including a liquid flowing in a specified direction and exciting said liquid inside said region, the improvement wherein said liquid inside said region is excited according to a sequence such that the flip angle changes according to the position of said liquid along said direction.

2. The method of claim 1 wherein said sequence is such that the flip angle increases gradually along said direction from one side of said region to the other side of said region.

3. The method of claim 1 wherein said sequence includes the steps of gradually changing the magnitude of a slice selective gradient magnetic field applied to said liquid inside said region and changing the carrier frequency of a RF pulse applied to said liquid inside said region according to the change in said magnitude of said gradient magnetic field.

4. In a magnetic resonance imaging apparatus comprising means for applying a slice selective gradient magnetic field and a RF excitation pulse to a selected slab-like region containing a liquid flowing in a specified direction, the improvement wherein said apparatus further comprises a control means for causing the flip angle of said RF excitation pulse to vary according to the position of said liquid inside said region along said direction.

5. The apparatus of claim 4 wherein said control means includes first means for gradually changing the magnitude of said gradient magnetic field and second means for changing the carrier frequency of said RF excitation pulse according to the change in said magnitude of said gradient magnetic field.

6. The apparatus of claim 4 wherein said control means includes a differential RF coil having a sensitivity gradient along said direction.

* * * * *